(12) United States Patent
Adam et al.

(10) Patent No.: US 8,415,253 B2
(45) Date of Patent: Apr. 9, 2013

(54) LOW-TEMPERATURE IN-SITU REMOVAL OF OXIDE FROM A SILICON SURFACE DURING CMOS EPITAXIAL PROCESSING

(75) Inventors: Thomas N. Adam, Slingerlands, NY (US); Stephen W. Bedell, Wappingers Falls, NY (US); Alexander Reznicek, Mount Kisco, NY (US); Devendra K. Sadana, Pleasantville, NY (US)

(73) Assignee: International Business Machinees Corporation, Armonk, NY (US)

( * ) Notice: Subject to any disclaimer, the term of this patent is extended or adjusted under 35 U.S.C. 154(b) by 63 days.

(21) Appl. No.: 13/075,657

(22) Filed: Mar. 30, 2011

(65) Prior Publication Data
US 2012/0252216 A1    Oct. 4, 2012

(51) Int. Cl.
*H01L 21/311*    (2006.01)
(52) U.S. Cl.
USPC ....... 438/703; 438/694; 438/697; 257/E21.22
(58) Field of Classification Search ................... 438/694, 438/697, 703; 257/E21.22
See application file for complete search history.

(56) References Cited

U.S. PATENT DOCUMENTS

| | | | | |
|---|---|---|---|---|
| 5,395,769 | A * | 3/1995 | Arienzo et al. | 438/8 |
| 6,277,194 | B1 * | 8/2001 | Thilderkvist et al. | 117/94 |
| 2004/0185583 | A1 | 9/2004 | Tomoyasu et al. | |
| 2005/0191825 | A1 * | 9/2005 | Ghyselen et al. | 438/458 |
| 2007/0190787 | A1 * | 8/2007 | Loubet et al. | 438/689 |
| 2011/0263104 | A1 * | 10/2011 | Adam et al. | 438/479 |

OTHER PUBLICATIONS

Bogumilowicz et al. "Chemical vapour etching of Si, SiGe and Ge with HCl; applications to the formation of thin relaxed SiGe buffers and to the revelation of threading dislocations", Semicond. Sci. Technol. 20 (2005) 127-134.*
Rreznicek et al., "300mm SGOI/Strain-Si for High Performance CMOS", IEEE International SOI Conference, Oct. 4-7, 2004, Charleston, SC.
Reznicek et al., "Strained-Silicon/Silicon-Germanium-on-Insulator for High-Performance CMOS—a manufacturable process for 300 mm substrates", 1st Int'l Symposium on SiGe: Materials, Processing and Devices at 206th Meeting of Electrochemical Soc., Oct. 3-8, 2004, Honolulu, Hawaii.
Lei et al. "Advantage of Siconi Preclean Over Wet Clean for Pre Salicide Applicaitons Beyond 65nn Node," IEEE (ISSM) (2006).

* cited by examiner

*Primary Examiner* — Leonard Chang
(74) *Attorney, Agent, or Firm* — Ryan, Mason & Lewis, LLP

(57) ABSTRACT

Low-temperature in-situ techniques are provided for the removal of oxide from a silicon surface during CMOS epitaxial processing. Oxide is removed from a semiconductor wafer having a silicon surface, by depositing a SiGe layer on the silicon surface; etching the SiGe layer from the silicon surface at a temperature below 700 C (and above, for example, approximately 450 C); and repeating the depositing and etching steps a number of times until a contaminant is substantially removed from the silicon surface. In one variation, the deposited layer comprises a group IV semiconductor material and/or an alloy thereof.

17 Claims, 1 Drawing Sheet

LOW-TEMPERATURE IN-SITU REMOVAL OF OXIDE FROM A SILICON SURFACE DURING CMOS EPITAXIAL PROCESSING

FIELD OF THE INVENTION

The present invention relates generally to semiconductor devices, and, more particularly, to the removal of oxides and other contaminants from such semiconductor devices during fabrication.

BACKGROUND OF THE INVENTION

Epitaxy processes generally require a pristine silicon surface that is free of the oxygen and carbon that accumulate due to exposure to air. It is also known that an oxide impurity can grow on the silicon surface prior to and during the epitaxy process, due to the ambient atmosphere within reactors. A baking process is often employed to remove the oxide impurity. During the baking process, the contaminated wafer is typically baked at high temperatures (above 1000 C) inside an epitaxial reaction chamber under low pressure in a hydrogen atmosphere with hydrogen flowing over the silicon surface. The hydrogen reacts with the oxides on the silicon surface and the oxygen is carried away as water.

For blanket un-patterned wafers, an in-situ high-temperature bake in a clean inert or reducing atmosphere (Hydrogen) generates a clean silicon surface. Un-patterned wafers are typically baked at temperatures in a range of 1000-1200 C to remove the oxide impurity. Patterned wafers, however, are typically unable to withstand such high temperatures. Thus, for patterned wafers, an ex-situ rinse in dilute aqueous Hydrogen Fluoride is often employed to remove the native oxide followed by an in-situ medium-temperature bake (on the order of 750-900 C). It has been found that such oxide removal techniques for patterned wafers create comparably clean silicon surfaces if the "air-time" between the pre-clean dip and the pre-bake process is less than approximately 4 hours.

As semiconductor geometries have reduced in size, however, the previously employed baking temperature ranges are no longer appropriate. For example, with smaller dimensions, strain relaxation of epitaxially grown embedded source/drain stressors results in performance degradation due to the formation of local and extended defects. In addition, medium-temperature in-situ pre-bakes provide pathways for silicon surface movement on the atomic scale which causes corner rounding within the nanometer range. Thus, there is an increasing demand for pre-bake processes that can be performed at lower temperatures. With currently available and evolving semiconductor scaling, however, pre-bake temperatures below 750 C are inefficient for removing surface contamination.

A number of oxide removal techniques have been proposed or suggested for cleaning of silicon surfaces for the purpose of epitaxy processing. United States Patent Published Application No. 2004/0185583, entitled "Method of Operating a System for Chemical Oxide Removal," and J. Lei et al., "Advantage of Siconi™ Preclean Over Wet Clean for Pre Salicide Applications Beyond 65 nm Node," IEEE Int'l Symposium on Semiconductor Manufacturing (ISSM) (2006), each incorporated by reference herein, describe exemplary ex-situ chambers that can be clustered to an epitaxy chamber. These methods are based on ex-situ conversion of the native oxide into a volatile compound at room temperature with an optional very-low-temperature desorption step (near 100 C).

While these existing oxide removal techniques are promising, they suffer from a number of limitations, which if overcome, could further improve the ability to remove oxides from patterned wafers. For example, the noted oxide removal techniques are not in-situ to the epitaxy chamber and therefore the wafers tend to re-contaminate during the transfer from one chamber to another. In addition, the noted oxide removal techniques have only been shown to remove portions of the contamination with a relatively high density of defects remaining. A need therefore remains for improved techniques for removing oxide from patterned wafers.

SUMMARY OF THE INVENTION

Generally, low-temperature in-situ techniques are provided for the removal of oxide from a silicon surface during CMOS epitaxial processing. According to one aspect of the invention, oxide is removed from a semiconductor wafer having a silicon surface, by depositing a SiGe layer on the silicon surface; etching the SiGe layer from the silicon surface at a temperature below 700 C (and above, for example, approximately 450 C); and repeating the depositing and etching steps a number of times until a contaminant is substantially removed from the silicon surface. In one variation, the deposited layer comprises one or more of a group IV semiconductor material and an alloy thereof.

The depositing and etching steps can be performed under substantially similar temperature and pressure conditions, or different temperature and pressure conditions. The depositing and/or etching steps optionally employ direct and/or remove plasma assisted etching. The silicon surface can optionally be pre-cleaned before the disclosed oxide removal technique is employed.

The etching step can be performed under Ultra-High Vacuum (UHC), Reduced-Pressure Chemical Vapor Deposition (RPCVD), Low Pressure Chemical Vapor Deposition (LPCVD), and/or Atmospheric Pressure Chemical Vapor Deposition (APCVD) conditions.

A method for removing oxide from a semiconductor wafer having a silicon surface, comprising:

A more complete understanding of the present invention, as well as further features and advantages of the present invention, will be obtained by reference to the following detailed description and drawings.

DETAILED DESCRIPTION OF PREFERRED EMBODIMENTS

The present invention provides improved techniques for removing oxide from patterned wafers. According to one aspect of the invention, a method is provided for cleaning a semiconductor surface at previously unattainable low temperatures and in-situ to the epitaxy chamber. Generally, as discussed further below, one aspect of the invention removes oxide from a silicon surface by cycling the deposition of Silicon Germanium (SiGe) with etching at low temperatures. The present invention may be employed, for example, to remove oxide from a silicon surface during CMOS Front-End-Of-Line (FEOL) processing, where devices are patterned in the semiconductor.

Figure 1:
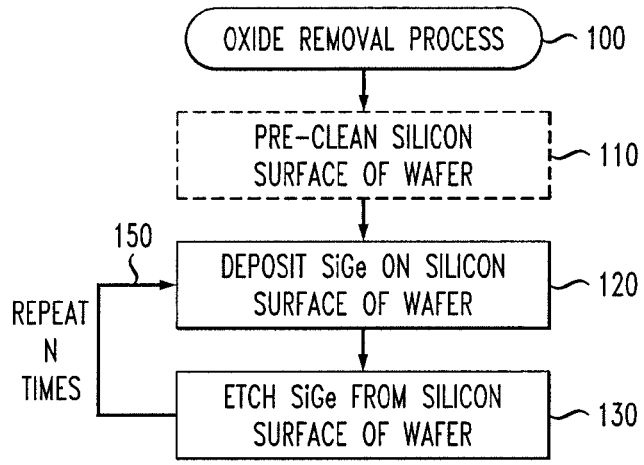
FIG. 1 is a flow chart describing an exemplary implementation of an oxide removal process incorporating features of the present invention.

FIG. 1 is a flow chart describing an exemplary implementation of an oxide removal process 100 incorporating features of the present invention. As shown in FIG. 1, the exemplary oxide removal process 100 initially and optionally pre-cleans the contaminated silicon surface 210 of a wafer 200 (as discussed further below in conjunction with FIG. 2) during step 110. For example, a well-known HF wet clean method can be employed for pre-cleaning during step 110.

Thereafter, a SiGe layer 310 (FIG. 3) is deposited on the contaminated silicon surface 210 of the wafer 200 during step 120. The affinity of Ge to form volatile or near-volatile substoichiometric oxides improves the invention, but other compatible group IV semiconductor materials can be used or alloys thereof (either doped or undoped) may be employed, such as intrinsic or doped Si, Ge, or $Si_{1-x}C_x$. The present invention recognizes that the planar deposition of SiGe is possible at moderate temperatures (350-700 C). In one exemplary implementation, the SiGe is deposited to a thickness of approximately 40 A during step 120. A SiGe material with a wide range of Germanium percentages may be employed during the deposition of step 120. However, the concentration is selected to maximize the sub-stoichiometric oxide removal efficiency and etching selectivity to silicon if a minimal substrate etching is required. Therefore, high Ge concentrations are typically desired. For the purpose of an exemplary implementation of the invention, a concentration of 25% germaniums (SiGe25%) was chosen.

Thereafter, as discussed further below in conjunction with FIG. 4, an in-situ etch in Chlorine (Cl2) is performed on the wafer 200 to remove the deposited SiGe layer 310 during step 130, for example, under Ultra-High Vacuum (UHC) conditions at a temperature of approximately 550 C. Alternatively, a wide variety of gaseous or liquid etchants are feasible as long the compatibility with the hardware, process flow, contamination requirements, and etching strength and selectivity is satisfied. Such alternative etchants may include, but are not limited to, halides (such as HCl), fluorides (such as F2 or SF6), and other etchant gases and mixtures of thereof. Both direct and remote plasma assisted etching are also possible. However, processing parameters such as temperature and pressure are typically desired to remain constant in order to minimize ramping transients that impact processing time. Therefore, the choice of etchant and its injection rate and excitation state should be tuned to the deposition conditions. As an example, a disilane-germane based SiGe deposition under UHV conditions may be performed at 550 C, while a dichlorosilane-germane based SiGe growth at reduced pressures (e.g. 10-600 T) may require temperatures as high as 700 C. Therefore, a DCS SiGe may be paired with a low pressure (10 T) HCl-based etching step at 600-700 C, while a disilane SiGe may require the use of Cl2 at much lower temperatures (450-550 C) and high-vacuum. Careful timing of both the deposition and etching process may be performed to control the amount of SiGe material that is deposited and removed during each cycle.

Steps 120 and 130 are repeated a number of times, N, as indicated by arrow 150, until the silicon surface 210 is sufficiently cleaned for CMOS FEOL processing. In one exemplary embodiment, steps 120 and 130 are repeated for approximately 15 cycles of SiGe deposition (approximately 10 seconds each) during step 120 and Cl2 etching (approximately 20 seconds) during step 130. For example, It has been found that by using a deposition depth of 40 A and a Germanium percentage of 25% (SiGe25%) during the deposition of step 120, a brief subsequent in-situ etch in Cl2 during step 130 effectively reduces the original surface contamination.

Figure 2:
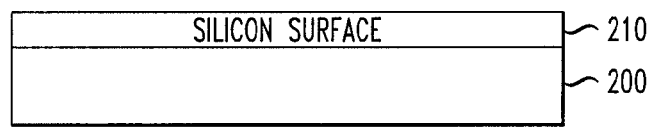
FIG. 2 illustrates a cross-sectional side view of an exemplary wafer having an exposed silicon surface, upon which the present invention can be employed.

FIG. 2 illustrates a cross-sectional side view of an exemplary wafer 200 having an exposed silicon surface 210 upon which the present invention can be employed. FIG. 2 illustrates the exemplary wafer 200 prior to application of the oxide removal process 100. While the present invention is illustrated in the context of CMOS FEOL processing, where devices are patterned in the semiconductor, the present invention can be applied to clean any exposed silicon surface that will be exposed to epitaxy, as would be apparent to a person of ordinary skill in the art. In addition, while the exemplary wafer 200 has a planar silicon surface 210, the present invention can be applied to a silicon surface 210 having any orientation or shape.

Figure 3:
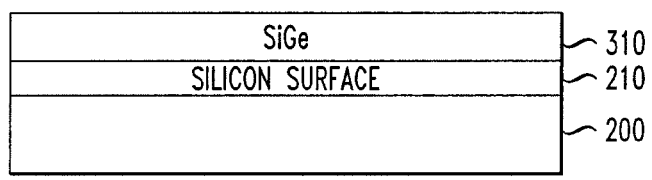
FIG. 3 illustrates a cross-sectional side view of the exemplary wafer of FIG. 2 following a step of the exemplary oxide removal process of FIG. 1.

FIG. 3 illustrates a cross-sectional side view of the exemplary wafer 200 of FIG. 2 following a step of the exemplary oxide removal process 100. In particular, FIG. 3 illustrates the exemplary wafer 200 of FIG. 2 following the deposition of a SiGe layer 310 during step 120 of the oxide removal process 100.

Figure 4:
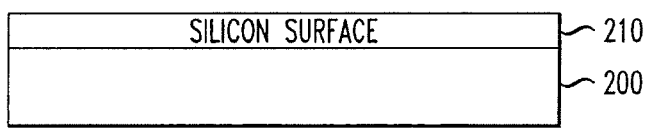
FIG. 4 illustrates a cross-sectional side view of the exemplary wafer of FIG. 2 following a subsequent step of the exemplary oxide removal process of FIG. 1.

FIG. 4 illustrates a cross-sectional side view of the exemplary wafer 200 of FIG. 2 following a subsequent step of the exemplary oxide removal process 100. In particular, FIG. 3 illustrates the exemplary wafer 200 of FIG. 2 following the etch removal of the SiGe layer 310 during step 130 of the oxide removal process 100.

The foregoing description discloses only exemplary embodiments of the invention. Modifications of the above disclosed structures and method which fall within the scope of the invention will be readily apparent to those of ordinary skill in the art. For example, while the present invention has been illustrated in the context of Ultra-High Vacuum Chemical Vapor Deposition, the present invention can also be employed in other reactors that operate in different pressure regimes, such as Reduced-Pressure Chemical Vapor Deposition (RPCVD), Low Pressure Chemical Vapor Deposition (LPCVD), or Atmospheric Pressure Chemical Vapor Deposition (APCVD).

Accordingly, while the present invention has been disclosed in connection with exemplary embodiments thereof, it should be understood that other embodiments may fall within the spirit and scope of the invention, as defined by the following claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for removing oxide from a semiconductor wafer having a silicon surface, comprising:
   depositing a SiGe layer on the silicon surface;
   removing said SiGe layer from the silicon surface at a temperature below 700° C.; and
   repeating said depositing and removing steps a number of times until an oxide is substantially removed from the silicon surface.

2. The method of claim 1, wherein said temperature is above approximately 450° C.

3. The method of claim 1, wherein said depositing and removing steps are performed under substantially similar temperature and pressure conditions.

4. The method of claim 1, wherein said depositing and removing steps are performed under different temperature and pressure conditions.

5. The method of claim 1, wherein said one or more of said depositing and removing steps employ one or more of direct and remote plasma assisted etching.

6. The method of claim 1, further comprising the step of pre-cleaning the silicon surface.

7. The method of claim 6, wherein the step of pre-cleaning the silicon surface employs an HF wet clean method.

8. The method of claim 1, wherein said removing step is performed under one or more of Ultra-High Vacuum (UHC), Reduced-Pressure Chemical Vapor Deposition (RPCVD), Low Pressure Chemical Vapor Deposition (LPCVD), and Atmospheric Pressure Chemical Vapor Deposition (APCVD) conditions.

9. A method for removing oxide from a semiconductor wafer having a silicon surface, comprising:
   depositing a layer on the silicon surface, wherein said layer is comprised of one or more of a group IV semiconductor material and an alloy thereof;
   removing said layer from the silicon surface at a temperature below 700° C.; and
   repeating said depositing and removing steps a number of times until an oxide is substantially removed from the silicon surface.

10. The method of claim 9, wherein said one or more of said group IV semiconductor material and said alloy thereof comprise one or more of SiGe, intrinsic Si, doped Si, Ge, and $Si_{1-x}C_x$.

11. The method of claim 9, wherein said temperature is above approximately 450° C.

12. The method of claim 9, wherein said depositing and removing steps are performed under substantially similar temperature and pressure conditions.

13. The method of claim 9, wherein said depositing and removing steps are performed under different temperature and pressure conditions.

14. The method of claim 9, wherein said one or more of said depositing and removing steps employ one or more of direct and remote plasma assisted etching.

15. The method of claim 9, further comprising the step of pre-cleaning the silicon surface.

16. The method of claim 15, wherein the step of pre-cleaning the silicon surface employs an HF wet clean method.

17. The method of claim 9, wherein said removing step is performed under one or more of Ultra-High Vacuum (UHC), Reduced-Pressure Chemical Vapor Deposition (RPCVD), Low Pressure Chemical Vapor Deposition (LPCVD), and Atmospheric Pressure Chemical Vapor Deposition (APCVD) conditions.

* * * * *